United States Patent [19]
Sugita et al.

[11] Patent Number: 5,157,582
[45] Date of Patent: Oct. 20, 1992

[54] COMPOSITE ELECTRONIC PART

[75] Inventors: Yoshihiro Sugita; Masami Iwahara, both of Kyoto, Japan

[73] Assignee: Murata Manufacturing Co., Ltd., Japan

[21] Appl. No.: 718,226

[22] Filed: Jun. 20, 1991

[30] Foreign Application Priority Data

Jun. 20, 1990 [JP] Japan ................... 2-162178

[51] Int. Cl.[5] ................... H01G 4/10; H01C 13/00
[52] U.S. Cl. ................... 361/321; 338/334
[58] Field of Search ............... 361/320, 321; 338/195, 338/334, 275, 308, 309; 174/68.5

[56] References Cited

U.S. PATENT DOCUMENTS

| | | | |
|---|---|---|---|
| 2,566,666 | 9/1951 | Khouri et al. | 361/321 X |
| 3,996,502 | 12/1976 | Bratschun | 361/321 |
| 4,146,673 | 3/1979 | Headley | 219/121 X |
| 4,528,613 | 7/1985 | Stetson et al. | 361/321 |
| 4,650,923 | 3/1987 | Nishigaki et al. | 174/68.5 |
| 4,758,922 | 7/1988 | Ishigaki et al. | 361/321 X |
| 4,766,412 | 8/1988 | Takakura et al. | 338/308 X |

FOREIGN PATENT DOCUMENTS 4318015 7/1968 Japan .

Primary Examiner—Donald Griffin
Attorney, Agent, or Firm—Ostrolenk, Faber, Gerb & Soffen

[57] ABSTRACT

A surface-mountable composite electronic part comprising a capacitor element which includes a dielectric ceramic member and a film resistor combined therewith for forming an RC circuit. A plurality of external terminals are formed on both end surfaces of the capacitor element for extracting capacitance, while a plurality of wiring patterns are formed on a first major surface of the capacitor element to be connected with the external terminals. The film resistor is formed on the first major surface of the capacitor element on a protective film made of a glass material, and connects a pair of the wiring patterns with each other. When the film resistor is trimmed with a laser beam, the protective film prevents the dielectric ceramic member forming the capacitor element from being harmed by the laser beam.

12 Claims, 4 Drawing Sheets

COMPOSITE ELECTRONIC PART

BACKGROUND OF THE INVENTION

1. Field of the Invention

The present invention relates to a composite electronic part, and more particularly, it relates to a composite electronic part which comprises a capacitor element and a film resistor formed on its outer surface.

2. Description of the Background Art

A composite electronic part, which is capable of providing at least a capacitance component and a resistance component, can be manufactured in the following manner, for example: First, a multilayer ceramic capacitor element is prepared. The outer surface of this capacitor element is made of a dielectric ceramic material such as barium titanate, for example, and a plurality of internal electrodes are formed in the interior of such a dielectric ceramic member, to be capable of providing capacitance. A plurality of external terminals are formed on the outer surface of the capacitor element, in order to correct the capacitance to external circuits. Further, a plurality of wiring patterns are formed on the outer surface of the capacitor element, to be connected with the plurality of external terminals respectively. In addition, a film resistor is formed on the outer surface of the capacitor element, i.e., the dielectric ceramic member, in order to connect at least two of the wiring patterns with each other.

Such a film resistor is generally trimmed with a laser beam after formation thereof, in order to provide a prescribed resistance value.

However, although it is easy to partially trim the film resistor with a laser beam, it may unexpectedly be difficult to bring its resistance value to a prescribed level.

As the result of a study of the cause of such difficulty, it has been recognized that not only the film resistor but also the surface of the dielectric ceramic member, forming the capacitor element, is trimmed by the laser beam in the conventional trimming method. Thus, it can be inferred that the resistance of the dielectric ceramic member is reduced due to a change of its crystal structure since the dielectric ceramic member is at least rapidly heated by the laser beam when its surface is trimmed with the laser beam, and thereafter quenched to room temperature.

In order to prevent such a problem, the laser output may simply be suppressed so that the surface of the dielectric ceramic member is not influenced by the laser beam. In this case, however, it is impossible to sufficiently trim the film resistor.

SUMMARY OF THE INVENTION

Accordingly, an object of the present invention is to provide a structure of a composite electronic part having a film resistor which can be easily trimmed with a laser beam without damaging a corresponding capacitor element.

The composite electronic part according to the present invention comprises a capacitor element whose outer surface is formed by a dielectric ceramic member, which can provide capacitance in its interior. A plurality of external terminals are formed on the outer surface of the capacitor element, in order to correct the capacitance with external circuits. The capacitor element is further provided on its outer surface with a plurality of wiring patterns, which are connected with the plurality of external terminals respectively. A film resistor to be trimmed with a laser beam is formed to connect at least two of the wiring patterns with each other, while a protective film is formed between the film resistor and the outer surface of the capacitor element.

Thus, the protective film prevents the outer surface of the capacitor element from being trimmed when the film resistor is trimmed with the laser beam. Therefore, it is easy to adjust the resistance value of the film resistor to a prescribed level by trimming.

Preferably, the outer surface of the capacitor element has a pair of opposite end surfaces and a pair of opposite major surfaces, so that the external terminals are formed on at least one of the end surfaces while the wiring patterns and the protective film are formed on at least one of the major surfaces. Thus, it is possible to make the inventive composite electronic part surface-mountable.

The contour of the protective film is preferably located outwardly beyond that of the film resistor. Thus, it is possible to further reliably prevent the outer surface of the capacitor element from being trimmed when the film resistor is trimmed.

In the composite electronic part according to the present invention, the capacitor element can be further provided on its outer surface with a second external terminal that is not connected with the internal capacitance and a second wiring pattern which is connected with the second external terminal.

According to the present invention, the dielectric ceramic member forming the capacitor element is preferably made of barium titanate or titanium oxide. The protective film is preferably formed of a glass material. Such a protective film of a glass material is preferably at least 20 μm and not more than 40 μm in thickness. When the thickness of the protective film is at least 20 μm, it is possible to reliably prevent the capacitor element from being trimmed by laser beam dispersion even if the film resistor to be trimmed has a relatively large thickness. When the thickness of the protective film is not more than 40 μm, on the other hand, it is possible to prevent bleeding of wiring patterns which are formed thereon by printing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
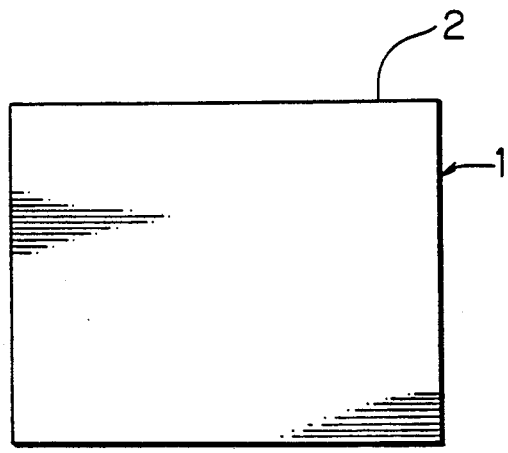
FIG. 1 is a plan view showing a capacitor element which is obtained in a first step of manufacturing a composite electronic part according to an embodiment of the present invention.
Figure 2:
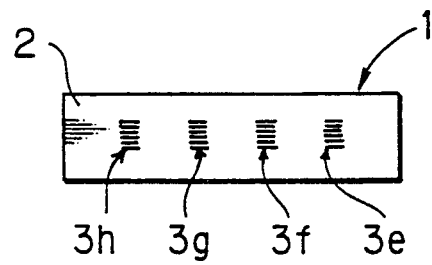
FIG. 2 is an end view of the capacitor element shown in FIG. 1.
Figure 3:
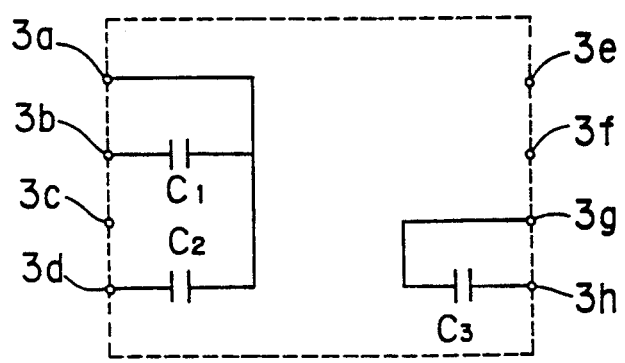
FIG. 3 is an equivalent circuit diagram of the circuit provided in the interior of the capacitor element shown in FIG. 1.

A composite electronic part according to an embodiment of the present invention is obtained through the following manufacturing steps, for example:

First, a capacitor element 1 shown in FIGS. 1 and 2 is prepared. The outer surface of the capacitor element 1 is formed by a dielectric member 2, which can provide capacitance in its interior. The dielectric ceramic member 2 is formed of a barium titanate or titanium oxide material. Such a capacitor element 1 has the structure of a multilayer ceramic capacitor, which is obtained by alternately stacking dielectric layers and electrode layers and simultaneously firing these layers. As shown in FIG. 3, a plurality of capacitance components C1, C2 and C3 are formed in the interior of the capacitor element 1. Further, a plurality of terminal electrodes 3a, 3b, 3c, 3d, 3e, 3f, 3g and 3h are formed on opposite end surfaces of the capacitor element 1. FIG. 2 shows an end surface exposing the terminal electrodes 3e to 3h. Among the terminal electrodes 3a to 3h, the terminal electrodes 3a, 3b, 3d, 3g and 3h are connected with the electrode layers in the dielectric ceramic member 2 in order to extract capacitance, while the remaining terminal electrodes 3c, 3e and 3f are not connected with the electrode layers and do not serve for extracting capacitance.

Figure 4:
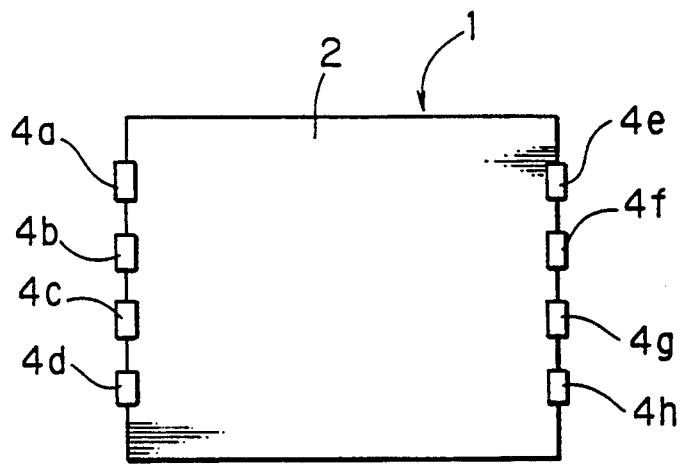
FIG. 4 is a plan view showing the capacitor element of FIG. 1 provided with external terminals on its outer surface.
Figure 5:
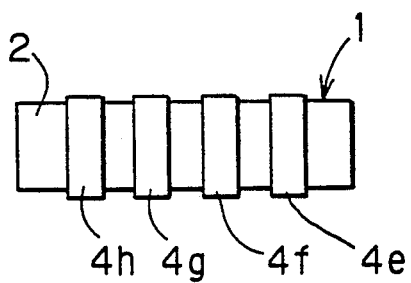
FIG. 5 is an end view of the capacitor element shown in FIG. 4.

Then, as shown in FIGS. 4 and 5, external terminals 4a to 4h are formed on the end surfaces of the capacitor element 1, to be electrically connected with the terminal electrodes 3a to 3h respectively. These external terminals 4a to 4h are formed by printing conductive paste onto prescribed regions of the end surfaces of the capacitor element 1 and baking the same. According to this embodiment, respective parts of the respective external terminals 4a to 4h, which are provided on the end surfaces of the capacitor element 1, extend toward the opposite major surfaces of the ceramic member 2.

Figure 6:
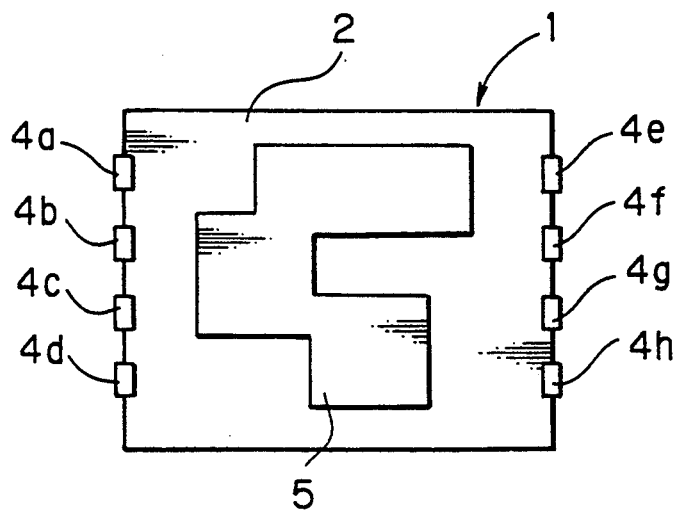
FIG. 6 is a plan view showing the structure of FIG. 4 provided with a protective film.
Figure 7:
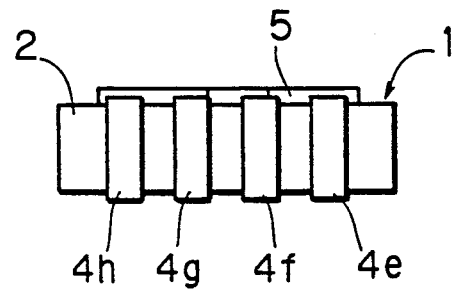
FIG. 7 is an end view of the structure shown in FIG. 6.

Then, as shown in FIGS. 6 and 7, a protective film 5 is formed on one first major surface of the capacitor element 1. The pattern of the protective film 5 is so selected as to include regions to be formed with film resistors, as described later. The protective film 5 is prepared from a glass material such as a borosilicate lead glaze, for example, which is printed and then fired at a temperature of about 500° to 1000° C., for example. The protective film 5 preferably has a thickness of at least 20 μm regardless of the thicknesses of the film resistors to be described later, in order to provide its protective effect. Further, the thickness of the protective film 5 is preferably not more than 40 μm, in order to prevent print bleeding of wiring patterns as hereinafter described.

Figure 8:
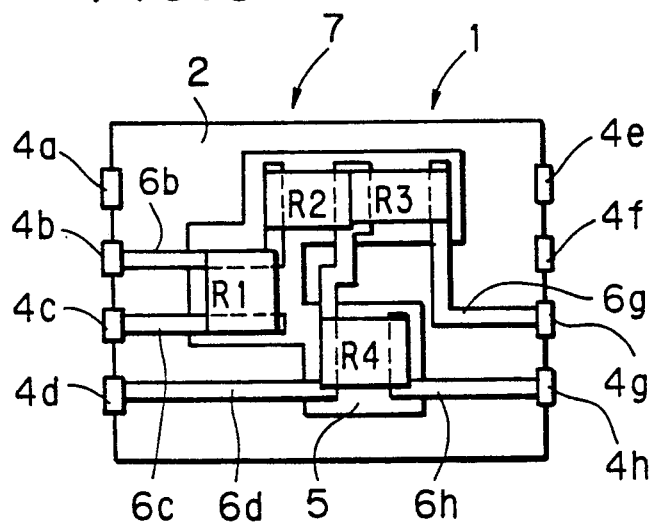
FIG. 8 is a plan view showing the structure of FIG. 6 provided with wiring patterns and film resistors.
Figure 9:
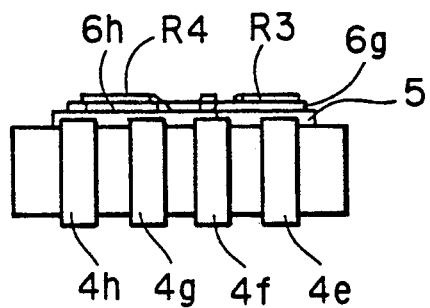
FIG. 9 is an end view of the structure shown in FIG. 8.

Then, as shown in FIGS. 8 and 9, wiring patterns 6b, 6c, 6d, 6g and 6h are formed on the first major surface of the capacitor element 1, and connected with the external terminals 4b to 4d, 4g and 4h respectively. The wiring patterns 6b to 6d, 6g and 6h are formed by printing conductive paste on the major surface of the capacitor element 1 and then firing the same. Parts of the wiring patterns 6b to 6d, 6g and 6h extend onto the protective film 5.

Then, film resistors R1, R2, R3 and R4 are formed on the protective film 5 in order to connect pairs of patterns selected from the wiring patterns 6b to 6d, 6g and 6h respectively. These film resistors R1 to R4 are formed by printing resistive paste onto the protective film 5 and then firing the same.

The aforementioned order of formation of the wiring patterns 6b to 6d, 6g and 6h and formation of the film resistors R1 to R4 may be reversed. If necessary, glaze layers may be further formed on the film resistors R1 to R4.

Figure 10:
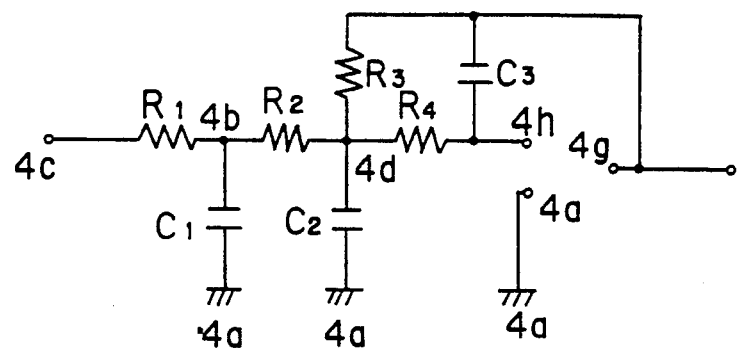
FIG. 10 is an equivalent circuit diagram of the circuits provided by the structure shown in FIG. 8.

The structure shown in FIGS. 8 and 9, i.e., a composite electronic part 7, provides an equivalent circuit shown in FIG. 10. According to this composite electronic part 7, it is possible to form an active filter circuit which functions as a tertiary low-pass filter etc., by employing the external terminal 4c as an input terminal and connecting the external terminals 4a, 4g and 4h to an IC forming a differential amplifier which is provided on an external circuit board (not shown), for example.

Figure 11:
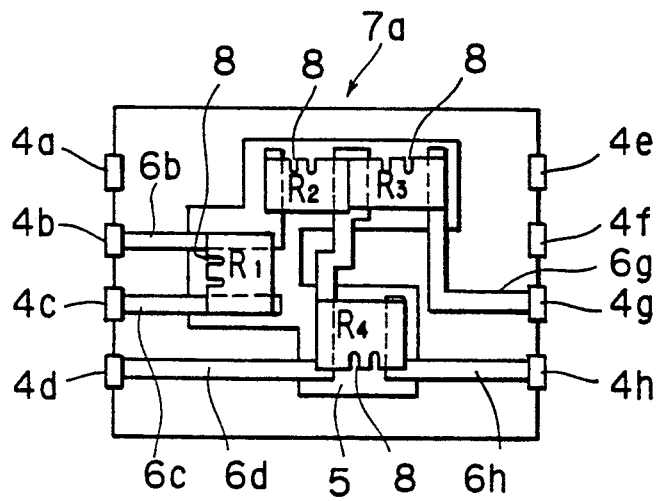
FIG. 11 is a plan view showing the structure shown in FIG. 8; after trimming

The composite electronic part 7 shown in FIGS. 8 and 9 is trimmed with a laser beam as shown in FIG. 11, so that the film resistors R1 to R4 provide prescribed resistance values respectively. In a composite electronic component 7a' shown in FIG. 11, traces 8 of trimming are recognized on the respective ones of the film resistors R1 to R4. All such traces 8 are located in regions covered with the protective film 5, so that the dielectric ceramic member 2 forming the capacitor element 1 is prevented from being affected by the laser trimming.

While the present invention has been described with reference to a preferred embodiment, various modifications are available within the scope of the present invention.

For example, although the composite electronic part 7 or 7a is formed by only passive elements forming an RC circuit, active elements such as transistors or semiconductor ICs may be further integrated therein.

When the inventive composite electronic part forms an RC circuit, the same may have a simple structure containing only one capacitance component and only one resistance component.

The protective film, the wiring patterns and the film resistors may be formed on both major surfaces of the capacitor element respectively.

In the aforementioned embodiment, the external terminals 4a to 4h may be provided after the wiring patterns 6b to 6d, 6 g and 6 h as well as the film resistors R1 to R4 are formed.

The protective film, the wiring patterns and the film resistors may be covered with appropriate armoring members.

Figure 12:
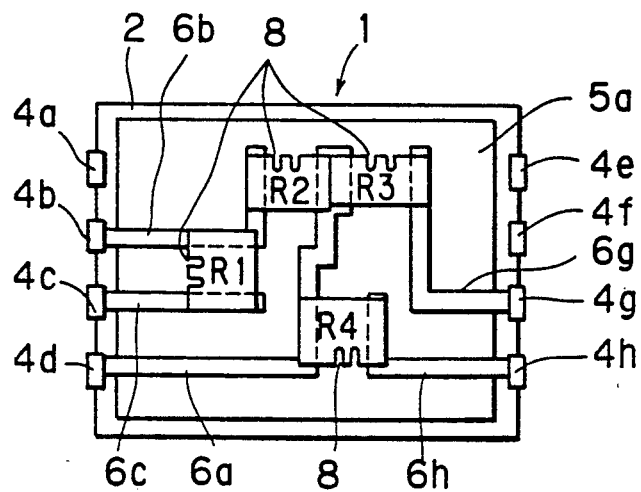
FIG. 12 illustrates a composite electronic part according to another embodiment of the present invention corresponding to a modification of FIG. 11.

As shown in FIG. 12, a protective film 5a may be formed in sufficiently large dimensions as compared with those of film resistors R1 to R4, to cover most of the major surface of a capacitor element 1. Referring to FIG. 12, elements corresponding to those shown in FIG. 11 are indicated by similar reference numerals.

The material for the protective film is not restricted to the aforementioned borosilicate lead glaze, but may be prepared from borosilicate a glaze including a borosilicate bismuth glaze, or an aluminosilicate glaze. In other words, the protective film may be made of any material as long as the same can prevent trimming of the dielectric ceramic member, forming the capacitor element, during the later resistor trimming step.

Although the present invention has been described and illustrated in detail, it is clearly understood that the same is by way of illustration and example only and is not to be taken by way of limitation, and scope of the present invention being limited only by the terms of the appended claims.

What is claimed is:

1. A composite electronic part having a capacitor element, and a film resistor which can be laser-trimmed without substantially affecting the capacitor element, the composite electronic part comprising:
   a capacitor element having an outer surface formed by a dielectric ceramic member which includes a material capable of providing capacitance in its interior and selected from the group consisting of barium titinate and titanium oxide;
   a plurality of external terminals formed on said outer surface of said capacitor element which connect said capacitance to the exterior of said dielectric ceramic member;
   a plurality of wiring patterns formed on said outer surface of said capacitor element and connected with said plurality of external terminals respectively;
   a film resistor, exposed to the exterior in order to be trimmed with a laser beam, connecting at least two of said wiring patterns with each other; and
   a protective film formed between said film resistor and said outer surface of said capacitor element, said protective film being effective for protecting said outer surface from being adversely affected by laser energy directed at said film resistor when said film resistor is being trimmed, said protective film having a thickness in the range of from about 20 μm to about 40 μm and being formed to include material selected from the group consisting of borosilicate glaze and aluminosilicate glaze.

2. A composite electronic part in accordance with claim 1, wherein said outer surface of said capacitor element has a pair of opposite end surfaces and a pair of opposite major surfaces, said external terminals are formed on at lest one said end surface, and said wiring patterns and said protective film are formed on at least one said major surface.

3. A composite electronic part in accordance with claim 2, wherein said protective film substantially covers said at least one said major surface.

4. A composite electronic part in accordance with claim 1, wherein an outer contour of said protective film is located outwardly beyond an outer contour of said film resistor.

5. A composite electronic part in accordance with claim 4, wherein said outer surface of said capacitor element has a pair of opposite end surfaces and a pair of opposite major surfaces, said external terminals are formed on at least one said end surface, and said wiring patterns and said protective film are formed on at lest one said major surface; and said protective film substantially coves said at least one said major surface.

6. A composite electronic part in accordance with claim 1, further comprising a second external terminal formed on said outer surface of said capacitor element and not connected to said capacitance of said dielectric ceramic member.

7. A composite electric part in accordance with claim 6, further comprising a second wiring pattern formed on said outer surface of said capacitor element and connected with said second external terminal.

8. A composite electronic part in accordance with claim 7, wherein said film resistor is connected to said second wiring pattern.

9. A composite electronic part in accordance with claim 7, wherein said composite electronic part has a plurality of film resistors.

10. A composite electronic part in accordance with claim 9, wherein at least one of said film resistors is connected to said second wiring pattern.

11. A composite electronic part in accordance with claim 1, further comprising at least an additional film resistor, and said composite electronic part provides a plurality of capacitances and a plurality of resistances at said external terminals.

12. A composite electronic part in accordance with claim 1, wherein said borosilicate glaze is selected from the group consisting of borosilicate lead glaze and borosilicate bismuth glaze.

* * * * *